US009533914B2

(12) United States Patent
Mahieu et al.

(10) Patent No.: US 9,533,914 B2
(45) Date of Patent: Jan. 3, 2017

(54) METHOD FOR DEPOSITING LAYERS ON A GLASS SUBSTRATE BY MEANS OF LOW-PRESSURE PECVD

(75) Inventors: Stijn Mahieu, Jumet (BE); Eric Tixhon, Jumet (BE); Martin Van Stuyvenberg, Jumet (BE); Hugues Wiame, Jumet (BE)

(73) Assignee: AGC GLASS EUROPE, Bruxelles (BE)

( * ) Notice: Subject to any disclaimer, the term of this patent is extended or adjusted under 35 U.S.C. 154(b) by 114 days.

(21) Appl. No.: 14/122,111

(22) PCT Filed: May 24, 2012

(86) PCT No.: PCT/EP2012/059734
§ 371 (c)(1),
(2), (4) Date: Nov. 25, 2013

(87) PCT Pub. No.: WO2012/160145
PCT Pub. Date: Nov. 29, 2012

(65) Prior Publication Data
US 2014/0099451 A1    Apr. 10, 2014

(30) Foreign Application Priority Data
May 25, 2011    (BE) .................................... 2011/0322

(51) Int. Cl.
*C23C 16/34*    (2006.01)
*C03C 17/22*    (2006.01)
(Continued)

(52) U.S. Cl.
CPC ........... *C03C 17/225* (2013.01); *C03C 17/002* (2013.01); *C03C 17/245* (2013.01); *C03C 17/366* (2013.01);
(Continued)

(58) Field of Classification Search
CPC .................................. C23C 16/34; C23C 16/40
See application file for complete search history.

(56) References Cited

U.S. PATENT DOCUMENTS

2008/0196664 A1*  8/2008  David et al. ................... 118/623
2010/0028238 A1*  2/2010  Maschwitz ................... 423/335

FOREIGN PATENT DOCUMENTS

WO    2010 017185    2/2010
WO    2011 029096    3/2011

OTHER PUBLICATIONS

Madocks et al; Plasma Enhanced Chemical Vapor Deposition (PECVD) for Large Area Applications; Society of Vacuum Coaters; 2010; pp. 247-251.*

(Continued)

*Primary Examiner* — Elizabeth Burkhart
(74) *Attorney, Agent, or Firm* — Oblon, McClelland, Maier & Neustadt, L.L.P.

(57) ABSTRACT

The invention relates to a method for producing metal or semiconductor oxide, nitride or oxynitride films on a substrate, by means of the PECVD method, including the steps that involve: (i) having a low-pressure PECVD device including at least one plasma source that includes at least one electrode connected to an AC, DC, or drawn DC generator for depositing said films on the substrate; and (ii) applying electrical power to the plasma source and applying, on the substrate, an oxide film gas precursor made of metal or semiconductor nitrides or oxynitrides and a reactive gas made of oxygen, oxygen derivatives, or nitrogen derivatives. The invention also relates to metal or semiconductor oxide, nitride, or oxynitride films obtained by the method.

32 Claims, 1 Drawing Sheet

Figure 1:
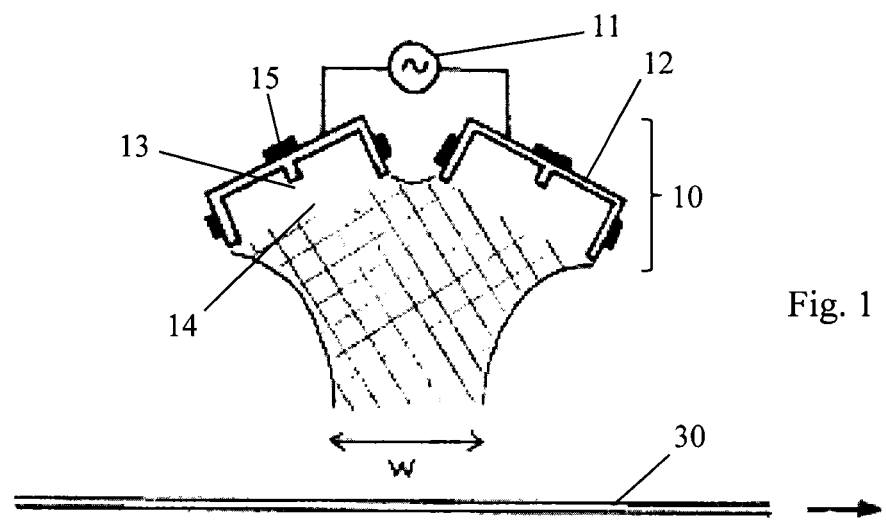

(51) Int. Cl.
C23C 16/40 (2006.01)
C23C 16/503 (2006.01)
C03C 17/245 (2006.01)
C03C 17/00 (2006.01)
C03C 17/36 (2006.01)

(52) U.S. Cl.
CPC ............... *C23C 16/34* (2013.01); *C23C 16/40* (2013.01); *C23C 16/402* (2013.01); *C23C 16/503* (2013.01); *C03C 2217/213* (2013.01); *C03C 2217/734* (2013.01); *C03C 2217/78* (2013.01); *C03C 2218/153* (2013.01)

(56) References Cited

OTHER PUBLICATIONS

Madocks et al; Large Area Plasma Enhanced Chemical Vapor Deposition of siO2 on glass and plastic; Society of Vacuum Coaters, 2007; pp. 233-238.*

George, M. A., et al., "Latest Innovations in Large area web coating technology via plasma enhanced chemical vapor deposition source technology", Journal of Vacuum Science and Technology A, vol. 27, No. 4, XP002665793, (Jul./Aug. 2009).

Madocks, J., et al., "Packaging barrier films deposited on PET by PECVD using a new high density plasma source", Materials Science and Engineering B, vol. 119, No. 3 , pp. 268-273, XP025304619, (Jun. 2005).

Howells, D.G., et al., "High quality plasma enhanced chemical vapour deposited silicon oxide gas barrier coatings on polyester films", Thin Solid Films, vol. 516, No. 10, pp. 3081-3088, XP022500306, (Nov. 2007).

Chandra, et al., "Low Temperature Plasma Chemical Vapor Deposition (PCVD) of Fluorinated Tin-Oxide Transparent Conducting Oxide", Photovoltaic Specialists Conference (PVSC), 2009 34th IEEE, Piscataway, pp. 1519-1522, XP031626629, (Jun. 2009).

Shang, Q., et al., "N-Type and P-Type C-Si Surface Passivation By-Remote PECVD AlOx for Solar Cells", 2010 35th IEEE Photovoltaic Specialists Conference, pp. 003141-003144, XP055014857, (Jun. 2010).

George , M., et al, "Silicon Nitride ARC Thin Films by New Plasma Enhanced Chemical Vapor Deposition Source Technology", 2008 33rd IEEE Photovolatic Specialists Conference, p. 1-5, XP055014854, (May 2008).

International Search Report Issued Jul. 2, 2012 in PCT/EP12/59734 Filed May 24, 2012.

* cited by examiner

U.S. Patent        Jan. 3, 2017        US 9,533,914 B2

METHOD FOR DEPOSITING LAYERS ON A GLASS SUBSTRATE BY MEANS OF LOW-PRESSURE PECVD

The present invention relates to a process for the deposition of layers on a glass substrate by low-pressure PECVD using precursors of organometallic type.

The deposition of layers, such as $SiO_2$ and $TiO_2$, by the cathode sputtering technique, in particular magnetron sputtering, exhibits the advantage of making it possible to obtain thin layers of compounds in the form, for example, of polycrystals. This advantage renders this technique very widespread in the glass field and this technique is also compatible with the processes of microelectronics.

Recent studies have shown that the PECVD ("Plasma Enhanced Chemical Vapor Deposition") technique has increasing advantages in the industrial world, in particular in the field of glass.

PECVD results from CVD (Chemical Vapor Deposition). CVD consists in sending, over a hot substrate, prevaporized chemical reactants or precursors which decompose by pyrolysis on contact with the hot substrate. This process is commonly applied "on-line" during the production of float glass. Thin layers (of the order of a few nanometers to hundreds of nm), in particular of oxides, are thus obtained. The layers obtained are dense, are of high purity and are generally very stable chemically and mechanically. The deposition rates are high.

However, the range of materials which can be deposited by CVD is limited as it is difficult to find precursors which can be volatilized and which will pyrolyze within the range of temperatures accessible to glass manufacturers (500-750° C.). One possibility of obviating the temperature of the substrate and thus of widening the range of the precursors which can be used in CVD and consequently the range of materials which can be deposited is to combine conventional CVD, optionally at lower temperature, with a plasma device.

PECVD can be carried out using any plasma: nonthermal plasmas (out of equilibrium) or thermal plasmas (in equilibrium). Nonthermal plasmas are generally preferred. The active entities of the plasma, such as electrons, ions or radicals, typically exhibit energies of several electronvolts (eV) and can thus bring about the dissociation or the activation of the chemical precursors. In order to keep the plasma out of equilibrium, it is often necessary to operate at reduced pressure. The majority of the known PECVD techniques thus use low-pressure plasmas.

The plasma can be generated via sources employing known devices which are commercially available. The plasma sources should preferably ensure use over a broad pressure range and on as broad a panel as possible of substrates to be coated, produce a dense beam having a high efficiency and prevent fouling of the source and the use of filament-based electron sources. Mention may be made, as plasma sources, of PBS (Plasma Beam Source) sources, PDP (Penning Discharge Plasma) sources and microwave sources. Mention may be made, within the PBS sources, of hollow-cathode plasma sources (see, for example, WO 2010/017185) and linear dual-beam plasma sources (Dual Beam PBS™) originating in particular from GPi (General Plasma Inc.) (see, for example, H. Chandra et al., GPi, "Recent Development of Low Temperature PECVD of Transparent Conducting Oxide in Photovoltaic Applications", pp. 1-4, available online on the website www.generalplasma.com; J. Madocks et al., Material Science and Engineering B, 119 (2005), 268-273; J. Madocks et al., ICCG8-Braunschweig 2010—Proceedings, 139-143; US 2006/0177599 A1).

In comparison with magnetron sputtering, PECVD gives access to plasmas having lower temperatures, which makes possible the deposition of many more different materials. Furthermore, the films exhibit sufficient adhesion to the substrate to allow post-deposition treatments, such as tempering or rolling, and they can be obtained with greater thicknesses.

As mentioned above, the PECVD technology exhibits the advantage in particular of making possible depositions of different layers, which are transparent, semitransparent or nontransparent, based on oxides, nitrides, oxynitrides or oxycarbides of metals or semiconductors, such as $SiO_2$, $TiO_2$, $SnO_2$, $ZrO_2$ or $Al_2O_3$, in, for example, photovoltaic, solar-control or display applications. However, the physical, optical and electrical properties desired for such layers depend on parameters, such as the nature of the precursors used, the flow rate of the gases according to the reactive gas/precursors molar ratio, the nature of the reactive gases, the processing pressures and the plasma sources, as mentioned above.

By way of example, $SnO_2$:F layers were produced by PECVD, using "Dual PBS™" as source, on substrates with widths of several meters, in line, at a temperature T° C. of less than 130° C., with deposition rates of 200-300 nm.m/min and a better film uniformity than 3%, that is to say that the variation in thickness of the film under consideration over the entire width of the glass only varies by 3% at most. These $SnO_2$:F films exhibit a bulk resistivity of $2.18 \times 10^{-3}$ ohm·cm at 130° C., a lower value than that generally obtained with other PECVD methods at the same temperature, excellent electrical properties, as a result of a residual carbon content of less than 1%, and excellent optical properties via a low value of the coefficient $\epsilon$ (molar extinction coefficient) of less than 0.01 between 400 and 1100 nm (H. Chandra et al., cited above).

The paper by J. Madocks et al. (ICCG8-Braunschweig 2010—Proceedings, 139-143) describes a PECVD installation and the conditions for the deposition of $SiO_2$ barrier layers and their properties. It is shown therein that the $SiO_2$ layers obtained by this method exhibit much better barrier properties to the migration of the sodium ions than $SiO_2$ layers manufactured by magnetron sputtering. The implementation which is described therein is, in addition, more efficient as it makes it possible to operate with faster deposition rates (>150 nm.m/min), at a temperature of less than 50° C., and it makes it possible to operate in line to carry out depositions on an industrial scale. Furthermore, this paper also describes the properties of $TiO_2$ films, in particular while stressing the enhanced optical qualities of these films obtained with much greater deposition rates than with the magnetron.

However, in the case of $SiO_2$ and $TiO_2$ layers, a proportion of contaminants, such as carbon-based or hydrogen-based, is found, which may present problems with regard to the properties of the film during the subsequent heat treatment, such as the tempering of the glass with layer.

In the abovementioned paper by J. Madocks et al. (Material Science and Engineering B, 119, (2005), 268-273), the water-barrier properties of the $SiO_2$ layers on a polymer (polyethylene/PET) substrate were measured. To this end, the operating conditions showed that the water-barrier properties are enhanced when the $O_2$ (reactive gas) flow rate is reduced, which means that identical water-barrier properties can be obtained with an $SiO_2$ film one third as thick and this the more the $O_2$ flow rate is reduced, everything otherwise being equal. However, increases in the carbon contents in these films are observed with the corresponding decrease in the $O_2$ flow rate. This observation confirms what is already known: the more the $O_2$ content increases, the more the carbon content in the films decreases, that is to say that more $O_2$ molecules interact with the carbon of the organic precursors.

However, the $O_2$ flow rate alone is not sufficient to reduce the carbon content in an $SiO_2$ film, for example. Other parameters have an influence on this content, such as the electrical power applied to the electrodes of a PECVD device, more specifically the power density of the plasma, the flow rate and the nature of the precursors of $SiO_2$, such as TMDSO (tetramethyldisiloxane) and HMDSO (hexamethyldisiloxane), of $TiO_2$, such as tetraethoxytitanium, of $SnO_2$, such as tetramethyltin, of $Al_2O_3$, such as trimethylaluminum, with respect to the reactive gas, such as $O_2$, partial pressure. Consequently, these parameters determine the deposition rates (nm.m/min) as, in order to obtain a high deposition rate, it is necessary for the flow rate of gas formed of precursors to be high, which results in a low reactive gas partial pressure being chosen, leading to an unacceptable carbon content in the layers.

One of the objectives of the present invention is to obtain depositions of layers of oxides, of nitrides or of oxynitrides of metals or semiconductors by the use of a low-pressure PECVD process, which pressure is typically between 0.5 and 0.001 Torr, allowing rapid deposition rates and minimizing the amount of contaminants originating from the precursor.

The invention relates, in a first aspect, to a process for the production of films of oxides, of nitrides or of oxynitrides of metals or semiconductors on a substrate by the PECVD method, comprising the stages consisting in:
a) taking a low-pressure PECVD device comprising at least one linear dual-beam plasma source, which source comprises at least two electrodes connected to an AC or pulsed DC generator, for the deposition of said films on the substrate,
b) applying an electrical power between the two electrodes, so that the power density of the plasma is between 5 and 50 W per $cm^2$ of plasma, and
c) applying, to the substrate, a gaseous precursor of films of oxides, of nitrides or of oxynitrides of metals or semiconductors at a flow rate of between 100 and 1000 sccm per linear meter of the plasma source and a reactive gas based on oxygen or on oxygen-comprising derivatives or on nitrogen-comprising derivatives at a flow rate of between 500 and 20 000 sccm per linear meter of the plasma source.

Alternatively, the invention relates to a process for the production of films of oxides, of nitrides or of oxynitrides of metals or semiconductors on a substrate by the PECVD method, comprising the stages consisting in:
a) taking a low-pressure PECVD device comprising at least one hollow-cathode plasma source, which source comprises at least one electrode connected to an AC, DC or pulsed DC generator, for the deposition of said films on the substrate,
b) applying an electrical power to the plasma source, so that the power density of the plasma is between 15 and 100 kW per meter of plasma, and,
c) applying, to the substrate, a gaseous precursor of films of oxides, of nitrides or of oxynitrides of metals or semiconductors at a flow rate of between 100 and 1000 sccm per linear meter of the plasma source and a reactive gas based on oxygen or on oxygen-comprising derivatives or on nitrogen-comprising derivatives at a flow rate of between 500 and 20 000 sccm per linear meter of the plasma source.

The applicant has shown that, by the use of the process, it is possible to obtain films of different oxides, nitrides or oxynitrides of metals or semiconductors in which residues originating from the precursor are present in contents of at most 2 atom %, indeed even of at most 0.5 atom %, advantageously of at most 0.1 atom %. The applicant has found that this is only possible by the necessary combination of the PECVD source connected at the generator of stage a), specific power densities of the plasma and when, preferably, the ratio of the flow rate of reactive gas to the flow rate of gaseous precursor is at least that necessary to obtain said films. By virtue of this low content of residues, the layers of these oxides, nitrides or oxynitrides, when deposited on a glass substrate, make it possible to retain, indeed even optimize, the optical, electrical and structural properties, such as properties of barrier to migration of the sodium ions, properties of control of the haze, scratch-resistant properties or antireflective properties, making it possible to "refresh" the surfaces of the glass substrates, and/or to ensure homogeneous and fault-free tempering of the film thus deposited. The PECVD process exhibits all the processing advantages listed above: high deposition rate, typically of the order of at least 100 nm.m/min., ease of processing on the industrial scale, excellent uniformity of the layers obtained (<5%) and moderate costs of the installations.

In the context of the invention, the term "residues originating from the precursor" is understood to mean any atom present in the starting precursor molecule which is re-encountered in undesired fashion in the film.

The power density of the plasma is defined as being the power dissipated in the plasma generated at the electrode(s), with reference to the size of the plasma.

The "linear meter of the plasma source", also referred to here as "total length of the plasma", is defined as the distance between the ends of the plasma in the direction of the width of the substrate to be coated.

For a linear dual-beam plasma source, the "power density of the plasma" can be defined as the total power applied to the source, divided by the total surface area of the plasma, itself defined as the surface area parallel to the substrate filled with the plasma originating from the plasma source and calculated by multiplying the total length of the plasma by its total width. The "total width of the plasma" is defined as the distance between the ends of the plasma in the direction of forward progression of the substrate to be coated.

For a hollow-cathode plasma source, the "power density of the plasma" can be defined as the total power applied to the source, divided by the total length of the plasma.

More specifically, the reactive gas/gaseous precursor molar ratio is advantageously, for the films of $M^{(x)}O_{x/2}$ type, greater than or equal to $(x/2-y)/z$, x being the valency of the metal oxide to be obtained, y being the number of oxygen atoms present in the starting precursor and z being the number of oxygen atoms present in the reactive gas.

Likewise, the molar ratio of the gases, for the films of $M^{(x)}N_{x/3}$ type, is advantageously greater than or equal to $(x/3-y)/z$, x being the valency of the metal nitride to be obtained, y being the number of nitrogen atoms present in the starting precursor and z being the number of nitrogen atoms present in the reactive gas.

Stage a) of the process requires a low-pressure PECVD device, which pressure is preferably between 0.001 and 0.5

Torr, preferably between 1 and 30 mTorr and more preferably between 3 and 20 mTorr, which device is provided with a linear dual-beam plasma source or with a hollow-cathode plasma source connected to an AC or pulsed DC generator, the frequencies of which are usually between 5 and 150 kHz, preferably between 5 and 100 kHz, or to a DC generator (the latter only in the case of a hollow-cathode source).

PECVD devices comprising a linear dual-beam plasma source which are particularly suitable for the invention are available commercially and can originate, for example, from GPi (General Plasma Inc—USA). They are linear dual-beam plasma sources connected to an AC or pulsed DC generator. Such sources are also available commercially under the term "Dual Beam PBS™" (Plasma Beam Source). Alternatively, PECVD devices comprising a plasma source based on a hollow cathode, which is also connected to the abovementioned generators, are also particularly suitable for the invention.

A PECVD device example is described below. The PECVD source is connected to a vacuum chamber. This vacuum chamber is arranged so that it makes it possible to have, next to one another, different sources having different deposition forms. Usually, these sources, which make possible different deposition forms, are flat or rotating cathodes for magnetron sputtering depositions. A specific cover was manufactured so as to make possible the installation of the PECVD source at a position where normally a magnetron sputtering source is installed. This type of vacuum chamber or coater is arranged in order to carry out complex depositions of layers (stackings) on substrates having large dimensions, for example a glass sheet with a width of 3.21 m and a length of 6 m, the substrate successively moving under the deposition sources. As such, this vacuum chamber, thus modified, makes possible complex depositions of layers combining depositions by magnetron sputtering and by PECVD on large-size substrates.

The PECVD source used can be composed of a linear dual-beam plasma source comprising two cavities in which discharge takes place and openings from which it is expelled. Each cavity is connected to a pipe which makes it possible to introduce, into the cavity, a gas which will be ionized and includes an electrode connected to a power generator which produces either alternating current (AC) or pulsed DC. The electrode is capable of withstanding at least one magnetron discharge in the cavity. The plasma source includes a series of magnets which face one another and which line the cavity. These magnets are positioned so as to create a magnetic field null point in the cavity where the discharge takes place. As the electrodes of each cavity are connected to the AC generator, alternately, at each half cycle, they are either the anode or the cathode. The gas injected into each cavity is thus ionized and forms an ion beam; it forms what is known as a plasma source which is emitted out of the source via an opening in the direction of the substrate.

Alternately, the PECVD source used can be composed of a hollow cathode comprising, for example, two cavities forming two electrodes connected to an AC or pulsed DC generator, in which discharge takes place, and openings from where it is expelled. Each cavity is connected to a pipe which makes it possible to introduce, into the cavity, a gas which will be ionized.

The ionizable gas is generally $O_2$ or an $O_2/Ar$ mixture for the deposition of oxides, nitrogen ($N_2$) or an $N_2/Ar$ mixture for the deposition of nitrides, and an $N_2/O_2$ or $N_2/O_2/Ar$ mixture for the deposition of oxynitrides. The frequency of the power generator is usually between 5 and 150 kHz, preferably between 5 and 100 kHz. Apart from the plasma source, the condensable precursor gas is injected uniformly along the plasma source. This precursor gas is activated by this plasma. The substrate is taken close to the source and a thin layer is deposited on the substrate from the activated gas. The amount of ionizable gas introduced into the cavity is controlled by mass flowmeters which are placed on the pipe between the gas reservoir and the plasma source. The amount of precursor gas injected into the plasma and the flow rate of ions are controlled by a liquid/vapor mass flowmeter. The working pressure range for the plasma source is usually between 1 and 500 mTorr. Pumping is preferably provided by turbomolecular pumps. In order to obtain good uniformity of the deposition on the substrate, pumping upward through the source is preferred.

Preferably, the ratio of the reactive gas flow rate to the gaseous precursor flow rate is at least 5, advantageously between 5 and 30.

The temperature to which the substrate is brought is between 20° C. and 550° C. The substrate is very advantageously a normal glass substrate, such as a clear, extra clear or colored glass, of variable thickness. Also concerned may be metal substrates, such as steel, or polymers, such as polyethylene-derived polymers. In the context of the invention, the substrate can also be a substrate which is already precoated with another layer, as in the case of a stack on a substrate intended for solar control or for photovoltaic, decorative (for example mirrors), architectural and motor vehicle uses. Thus, the layers according to the invention can advantageously be used as outermost layer of a stack, or within the stack, or directly on the glass, in order, for example, to confer, on the substrate thus coated, antireflective, scratch-resistant, haze-control or barrier layer properties.

Preferably, the films of oxides, of nitrides or of oxynitrides of metals or semiconductors are chosen from the group consisting of $SiO_2$, $TiO_2$, $ZrO_2$, $Al_2O_3$, AlN, TiN, ZnO, silicon nitride, TaN, $WO_3$, $Cr_2O_x$, x being between 3 and 6, and CrN, it being possible for said components to be doped, and also the alloys of these components or others, comprising at most 2 atom % of precursor residues, chosen in particular from the group consisting of H, C, Cl, $CH_x$ derivatives, $NH_x$ derivatives and $OH_x$ derivatives, x being between 1 and 4. Whatever the nature of the residue, the latter is present in an amount of at most 2 atom %, advantageously of at most 0.5 atom % and very advantageously of at most 0.1 atom %, with respect to the total number of metal atoms of the film. This content is preferably determined by photoelectron spectroscopy XPS or by secondary ionization mass spectrometry SIMS; it can also be determined by Raman spectroscopy, by ion beam analysis analytical techniques, such as NRA and RBS, and others.

Preferably, in stage a), the source of the PECVD device has dimensions of between 250 mm and 4000 mm in length and between 100 and 800 mm in width, providing a power of between 5 kW per linear meter of the plasma source and 50 kW, advantageously between 10 and 35 kW per meter of the plasma source.

In stage b), in the case of a linear dual-beam plasma source, a power density is applied between the two electrodes so that the power density is between 5 and 50 W per $cm^2$ of plasma. Below this power density of 5 W per $cm^2$ of plasma, a significant presence of precursor residues is observed and, above 50 W per $cm^2$ of plasma, the formation of powder in the gas phase prejudicial to the quality of the deposition is observed.

In stage b), in the case of a hollow-cathode plasma source, a power density is applied between the two electrodes so that the power density is between 15 and 100 kW per meter of plasma, preferably between 15 and 60 kW per meter of plasma. Below this power density of 15 kW per m of plasma, a significance presence of precursor residues is observed and, above 100 kW per m of plasma, indeed even sometimes above 60 kW per m of plasma, the formation of powder in the gas phase prejudicial to the quality of the deposition is observed.

The organic precursors of stage c) depend on the nature of the layer which will be deposited. These are volatile products, in particular at the temperatures at which the process is carried out. The precursors of $SiO_2$ are typically $SiH_4$ (silane), TMDSO (tetramethyldisiloxane) and HMDSO (hexamethyldisiloxane); of $TiO_2$, tetraethoxytitanium or TTIP (titanium tetraisopropoxide); of $SnO_2$, alkyltins, such as tetramethyltin, tin chloride ($SnCl_4$) or organotin chlorides, such as MBTC (monobutyltin trichloride); of $Al_2O_3$, alkylaluminums, such as trimethylaluminum; and of ZnO, alkylzincs, such as diethylzinc; this list not being exhaustive. As the case may be, the precursor can additionally comprise an additional precursor, for example in order to include a specific dopant, such as antimony or fluorine, in a layer typically of $SnO_2$. Such an additional precursor can be $SF_6$ for the fluorine and an organoantimony chloride compound for the antimony.

The flow rate of the gaseous precursor is between 100 and 1000 sccm (standard cubic centimeters per minute) per linear meter of the plasma source, preferably between 150 and 500 sccm or between 200 and 500 sccm per linear meter of the plasma source. This range is necessary in order to obtain high degrees of deposition appropriate to this technique, of the order of 100 to 400 nm. m/min.

The reactive gas is based on oxygen or on oxygen-comprising derivatives, the latter preferably being chosen from the group consisting of ozone, hydrogen peroxide, water and $CO_2$, or alternatively on nitrogen-comprising derivatives, preferably chosen from the group consisting of $N_2$, $NH_3$, $N_2O$ and HCN. According to embodiments, the reactive gas can in addition advantageously include an inert gas, such as helium, nitrogen, argon, neon or crypton, in order to promote the chemical dissociation of the precursors and to control the ion bombardment by the source. The proportion of inert gas in the total mixture (reactive gas/inert gas) is defined by the ratio of the flow rate of the reactive gas to the flow rate of the inert gas and is located in the range of 2-50, preferably of 10-30, very advantageously of 15-25. This choice makes it possible to control the density of the film obtained, of which the roughness (Ra) is a measurement. Preferably, Ra is less than 2 nm, indeed even of less than 0.5 nm, which, for an $SiO_2$ layer with, for example, a thickness of between 20 and 40 nm, can substantially improve the barrier properties.

The flow rate of the reactive gas is between 500 and 20 000 sccm per linear meter of the plasma source, preferably between 800 and 20 000 sccm or between 1000 and 20 000 sccm per linear meter of the plasma source. Such values have the advantage of ensuring an amount of reactive gas which is sufficiently greater than that of the precursors, making it possible to greatly restrict, indeed even to eliminate, the incorporation of C in the layer.

The layers are generally manufactured so that their geometric thickness is between 2 and 1500 nm, preferably between 20 and 800 nm, in particular between 20 and 600 nm. The chosen thickness depends on the technical effect desired for the substrates thus coated.

The applications of this process are related to the nature of the layer deposited on the substrate. Various embodiments of the invention, for different applications, are described below.

According to a first embodiment, the process is employed for the production of a glass substrate on which is deposited, in direct contact with the substrate, an $SiO_2$ layer, preventing the sodium ions from migrating from the glass (barrier layer). The carbon content of this layer should be as low as possible, less than 2 atom %, indeed even advantageously less than 0.1 atom %, in order to allow the substrate to be tempered. This low carbon content limits, indeed even prevents, on conclusion of the tempering, the appearance of defects, such as haze which is undesired, cracks and $CO_2$ bubbles trapped in the film. The layer thus obtained exhibits a good density measured by Ra of less than 2 nm, the thickness of which is between 10 and 40 nm. Usually, such a layer is employed during the production of a Low-E glass substrate, advantageously in line, a Low-E layer then being deposited on the $SiO_2$ barrier layer. The Low-E layers can be $SnO_2$:F, $SnO_2$:Sb, ITO (tin-doped indium oxide) or other layers obtained by magnetron, such as Ag-based multilayers. The process is then carried out with a power density of greater than 5 W per $cm^2$ of plasma, for a linear dual-beam plasma source, or of greater than 15 kW per meter of plasma, for a hollow-cathode plasma source, the rate of deposition being less than 400 nm. m/min, preferably between 200 and 100 nm. m/min. The pressures are between and 20 mTorr or 3 and 15 mTorr. Use is made, as precursor, of an organosilane derivative, such as TMDSO, and, as reactive gas, of pure oxygen, the ratio of the flow rate of oxygen to the flow rate of the organosilane derivative being greater than 5, preferably greater than 10, indeed even greater than 15, i.e. an oxygen flow rate of 1000 sccm for a linear source of 250 mm in length and a flow rate of precursors of 100 sccm. The source defined in stage a) of the PECVD device is preferably placed in front of the system for coating with subsequent layers, such as Low-E layers, which can be deposited by magnetron sputtering or by CVD. The above Ra values can also be obtained by the addition of an inert gas so that the ratio of the flow rate of the reactive gases to the flow rate of the inert gas is at least 5, advantageously between 5 and 30, preferably between 5 and 20, more preferably between 5 and 15, in particular in the vicinity of 8. In an alternative form, the abovementioned Ra values can be obtained by modifying the voltage of the cathode, which can be carried out by changing the constituent material of the electrode or by adapting the modules of the power generator or by modifying the pressure. Usually, a voltage of approximately 400 V changes to approximately 340 V, indeed even 300 V. In another alternative form, the desired Ra values can be obtained by increasing the pressure up to values of between 7 and 20 mTorr or between 7 and 15 mTorr, the values of 9-10 mTorr being those which give the best results.

According to a second embodiment, the process is employed for the production of $SiO_2$ layers deposited either directly on a glass substrate, or in a stack with other layers in any position, or else as outermost layer of a stack, for the control of the haze values in stacks intended for solar applications, such as photovoltaic applications, incorporating Low-E layers. The layer necessary has to comprise a carbon content of less than 0.2% and its thickness is typically from 2 to 100 nm. As the case may be, high haze values are necessary in order to promote the photovoltaic effect and to improve the photoconversion efficiency. In other applications, for example architectural applications, haze values which are as low as possible may be required. By adapting the parameters of the process of the invention, an SiO$_2$ layer can be provided which confers a high haze, of at least 5%, indeed even of at least 10-20%. To this end, the power density is at most 10 W per cm$^2$ of plasma, for a linear dual-beam plasma source, or at most 20 kW per meter of plasma, for a hollow-cathode plasma source, the flow rate of gaseous precursor of an organosilane derivative, such as TMDSO, is less than 400 sccm per linear meter of plasma source, preferably between 100 and 400 sccm per linear meter of plasma source, the ratio of the flow rate of oxygen (reactive gas) to the flow rate of the gaseous precursor is greater than 5, the rate of deposition being less than 400 nm.m/min, preferably between 300 and 200 nm. m/min. For low haze values, typically less than 0.5%, the power density is at least 5 W per cm$^2$ of plasma, for a linear dual-beam plasma source, and at least 15 kW per meter of plasma, for a hollow-cathode plasma source, the pressure is greater than 5 mTorr, the flow rate of gaseous precursor of an organosilane derivative, such as TMDSO, is less than 400 sccm per linear meter of plasma source, preferably between 100 and 400 sccm per linear meter of plasma source, the ratio of the flow rate of oxygen (reactive gas) to the flow rate of the gaseous precursor is greater than 15, the rate of deposition being less than 400 nm.m/min, preferably between 200 and 100 nm.m/min and ideally less than 100 nm.m/min.

According to a third embodiment, the process is employed in the production of layers chosen from the group consisting of SiO$_2$, ZrO$_2$ and Al$_2$O$_3$, deposited either directly on a glass substrate, or as outermost layer of a stack, with the aim of conferring scratch-resistant properties on the coated or uncoated substrate. The thickness of the layer, deposited directly on the glass substrate, is generally between 100 and 1500 nm, advantageously between 200 and 1000 nm, the power density being between 10 and 40 W per cm$^2$ of plasma, for a linear dual-beam plasma source, or between 20 and 50 kW per meter of plasma, for a hollow-cathode plasma source, the pressure is less than 10 mTorr, the flow rate of gaseous precursor of an organosilane derivative, such as TMDSO, is less than 600 sccm per linear meter of plasma source, preferably between 150 and 600 sccm per linear meter of plasma source, the ratio of the flow rate of oxygen (reactive gas) to the flow rate of the gaseous precursor is greater than 10, the rate of deposition being less than 400 nm.m/min, preferably between 200 and 100 nm.m/min.

DBT (Dry Brush Test) scratch-resistance tests carried out over 4000 cycles (ASTM D 2486) show, for example, must better results than for a bare glass substrate for SiO$_2$ layers of approximately 20 nm. When such a layer is deposited on a glass substrate precoated with a silver-based Low-E layer, the thickness of this silica layer should preferably be greater than 40 nm, preferably greater than 60 nm, advantageously of between 80 and 100 nm.

According to a fourth embodiment, the process is employed for the production of stacks on a glass substrate exhibiting antireflective (AR) properties. It is possible, for example, to consider a stack comprising a succession of layers of high refractive indices, such as TiO$_2$, and having low refractive indices, such as SiO$_2$. SiO$_2$ is then deposited by the process of the invention and TiO$_2$ by magnetron sputtering. This is possible by virtue of the highly transparent properties of SiO$_2$, the thicknesses of which are those conventionally used in this application. The absorption of light in the SiO$_2$ film should then be less than 1%, better still less than 0.5%, indeed even less than 0.2%. The process conditions to be chosen in this case are as follows. The power density is between 10 and 40 W per cm$^2$ of plasma, for a linear dual-beam plasma source, or between 20 and 50 kW per meter of plasma, for a hollow-cathode plasma source, the pressure being less than 20 mTorr, the flow rate of gaseous precursor of an organosilane derivative, such as TMDSO, is less than 400 sccm per linear meter of plasma source, preferably between 150 and 300 sccm per linear meter of plasma source, the ratio of the flow rate of oxygen (reactive gas) to the flow rate of the gaseous precursor is greater than 5 and ideally greater than 15, the rate of deposition being less than 400 nm.m/min, preferably between 100 nm.m/min and 200 nm.m/min or better still less than 100 nm.m/min. This guarantees a carbon content in the SiO$_2$ layer of less than 2%, indeed even of less than 0.5% or less than 0.1%.

For this same application (antireflective properties), a highly transparent SiO$_2$ layer can be deposited on a glass substrate which is coated with a Low-E layer, such as those described above. In this case, the Low-E layer is deposited, for example, by magnetron sputtering and the SiO$_2$ layer by the process of the invention, advantageously on the same line. The reflection on the layer side is reduced by 10%, advantageously reduced by 20-40%, with respect to a Low-E stack without this SiO$_2$ layer. The process is then carried out with a power density of greater than 5 W/cm$^2$ of plasma, for a linear dual-beam plasma source, or of greater than 15 kW per meter of plasma, for a hollow-cathode plasma source, the flow rate of gaseous precursor of an organosilane derivative, such as TMDSO, is less than 400 sccm per linear meter of plasma source, preferably between 100 and 300 sccm per linear meter of plasma source, the rate of deposition being less than 200 nm.m/min, preferably less than 150 nm.m/min, in particular less than 100 nm.m/min, the pressure being less than 20 mTorr. Use is made, as gaseous precursor, of an organosilane derivative, such as TMDSO, and, as reactive gas, of pure oxygen, the ratio of the flow rate of oxygen to the flow rate of the gaseous precursor being greater than 5, indeed even greater than 15.

According to a fifth embodiment, the process is employed in order to "refresh" the surface of the glass. In the case of a deposition by magnetron sputtering, the state of freshness of the surface of the glass is an essential parameter, in particular when subsequently the glass coated with layers has to be tempered. The glass should not exhibit traces of iredescence. In order to overcome this disadvantage, a deposition of carbon-free SiO$_2$ according to the process, directly on the glass, is an appropriate solution for refreshing the surface of the glass and making possible the use of old glass as supports for layers, such as Low-E layers, according to the magnetron technique.

Thus, the deposition of an SiO$_2$ layer makes it possible to avoid these drawbacks, advantageously when its thickness is between 20 and 60 nm. The roughness of the SiO$_2$ (Ra) should preferably be less than 5 nm, more preferably less than 2 nm, advantageously less than 0.5 nm.

The process is then carried out with a power density of greater than 5 W/cm$^2$ of plasma, for a linear dual-beam plasma source, or of greater than 15 kW per meter of plasma, for a hollow-cathode plasma source, the flow rate of gaseous precursor of an organosilane derivative, such as TMDSO, is less than 200 sccm per linear meter of plasma source, preferably of between 50 and 150 sccm per linear meter of plasma source, the rate of deposition being less than 200 nm.m/min, preferably less than 150 nm.m/min, in particular less than 100 nm.m/min, the pressure being less than 15 mTorr. Use is made, as gaseous precursor, of an organosilane derivative, such as TMDSO, and, as reactive gas, of pure oxygen, the ratio of the flow rate of oxygen to the flow rate of the gaseous precursor being greater than 5, indeed even greater than 15. The source defined in stage a) of the PECVD device is placed in front of the system for coating the subsequent layers, which can be deposited by magnetron sputtering or by CVD. This guarantees a carbon content in the $SiO_2$ layer of less than 2%, indeed even of less than 0.5% or than 0.1%.

The above values for carbon content can also be obtained by the addition of an inert gas so that the reactive gas/inert gas ratio is at least 5, advantageously between 5 and 30, in particular having a value of 20. The inert gas is preferably He, Ne, Kr and Ar.

In an alternative form, the values cited above for carbon content can be obtained by modifying the voltage of the cathode, which can be carried out by changing the constituent material of the electrode or by adapting the modules of the power generator or by modifying the pressure. Usually, a voltage of approximately 400 V changes to approximately 340 V, indeed even 300 V. In another alternative form, the desired values can be obtained by operating in a range of pressures of between 5 and 20 mTorr, preferably between 5 and 10 mTorr, the values of 9-10 mTorr being those which give the best results.

PECVD devices which can be used in processes according to the invention will now be described, by way of examples, all referring to FIGS. 1 and 2. The various components of the figures are not represented to scale.

FIG. 1: transverse section of a PECVD device comprising a linear dual-beam plasma source.

Figure 2A:
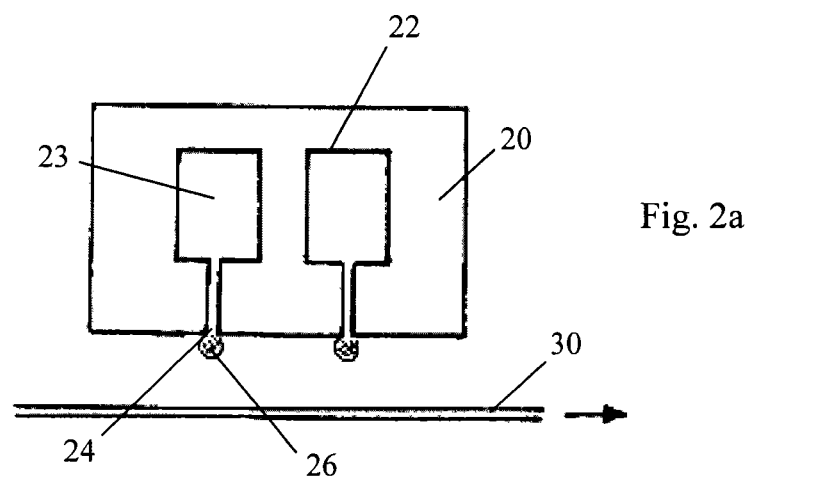

FIG. 2a: transverse section of a PECVD device comprising a hollow-cathode plasma source.

Figure 2B:
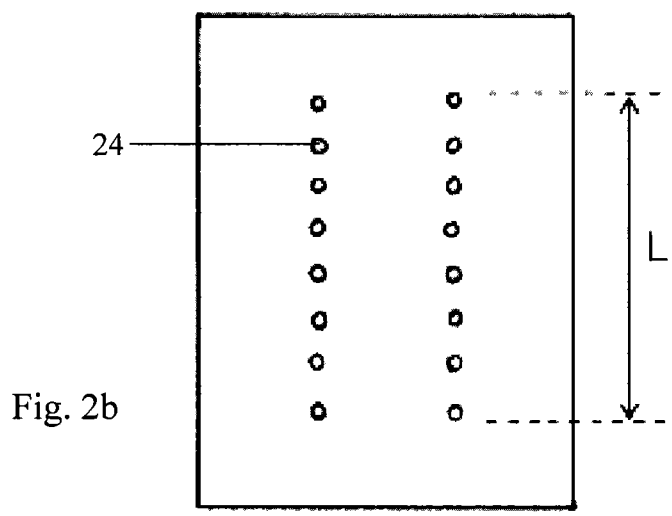

FIG. 2b: view of the lower face (facing the substrate) of a hollow-cathode plasma source.

In FIG. 1, the PECVD source represented is a linear dual-beam plasma source (10), comprising two cavities (13) in which discharge takes place and openings (14) from where it is expelled. Each cavity includes an electrode (12) connected to a power generator (11) which produces either alternating current (AC) or pulsed DC. The plasma source includes a series of magnets (15) which face one another and which line the cavity. The gas injected into each cavity is thus ionized and forms an ion beam; it forms what is known as a source of plasma (16) which is emitted out of the source via an opening (14) in the direction of the substrate to be coated (30). The arrow indicates the direction of forward progression of the substrate during the deposition. The total width of the plasma is represented by "w" and its total length is for its part measured perpendicularly, that is to say in the direction of the width of the substrate to be coated.

In FIG. 2, the PECVD source represented is a hollow-cathode plasma source (20) comprising two cavities (23) forming two electrodes (22) connected to an AC or pulsed DC generator (not represented), in which cavities discharge takes place, and openings (24) from where the plasma (26) is expelled in the direction of the substrate to be coated (30). The arrow indicates the direction of forward progression of the substrate during the deposition. The distance between the ends of the plasma in the direction of the width of the substrate to be covered is represented by "L". In this figure, the openings are provided in two rows of outlet holes but other configurations are possible: for example, just one range of holes or more than two ranges of holes, or one or more longitudinal slits.

The invention also relates to films of oxides, of nitrides or of oxynitrides of metals or semiconductors chosen from the group consisting of $SiO_2$, $TiO_2$, $SnO_2$, $ZrO_2$, $Al_2O_3$, AlN, TiN, ZnO, silicon nitride, TaN, $WO_3$, $CrO_x$ and CrN, it being possible for said components to be doped, and also the alloys of these components, comprising at most 2 atom % of residues originating from the precursor chosen in particular from the group consisting of H, C, Cl, $CH_x$ derivatives, $NH_x$ derivatives and $OH_x$ derivatives, x being between 1 and 4, which films are obtained by the use of the process.

This is because the applicant has shown that such films are very advantageously used in the production of layers or stacks of layers on substrates, in particular glass substrates. By virtue of this low content of compounds made up of the residues originating from the precursors, the layers of these oxides, nitrides or oxynitrides, when deposited on a glass substrate, make it possible to retain, indeed even to optimize, the optical, electrical, structural, such as barrier to the migration of the sodium ions, haze control, scratch-resistance and antireflective properties, making it possible to "refresh" the surfaces of glass substrates and/or to ensure homogeneous and fault-free tempering of the film thus deposited.

The invention claimed is:

1. A process for the production of films of oxides, of nitrides or of oxynitrides of metals or semiconductors on a substrate by the Plasma Enhanced Chemical Vapor Deposition (PECVD) method, comprising:
   a) providing a low-pressure PECVD device comprising at least one linear dual-beam plasma source, which source comprises at least two electrodes connected to an AC or pulsed DC generator, for the deposition of said films on the substrate,
   b) applying an electrical power between the two electrodes, so that a power density of a plasma is between 5 and 50 W per $cm^2$ of plasma, and
   c) applying, to the substrate, a gaseous precursor of films of oxides, of nitrides or of oxynitrides of metals or semiconductors at a flow rate of less than 400 sccm per linear meter of the plasma source and a reactive gas based on oxygen or on oxygen-comprising derivatives or on nitrogen-comprising derivatives at a flow rate of between 500 and 20,000 sccm per linear meter of the plasma source,
   wherein a ratio of the flow rate of the reactive gas to the flow rate of the gaseous precursor is greater than 5, and
   wherein a rate of deposition is less than 400 nm.m/min.

2. The process as claimed in claim 1, wherein the source of the PECVD device exhibits dimensions of between 250 mm and 4000 mm in length and between 100 and 800 mm in width, providing a power of between 5 kW and 50 kW per linear meter of the plasma source.

3. The process as claimed in claim 1, wherein a pressure of the PECVD device is between 0.001 and 0.5 Torr.

4. The process as claimed in claim 1, wherein frequencies of the AC or pulsed DC generator are between 5 and 150 kHz.

5. The process as claimed in claim 1, wherein a reactive gas/gaseous precursor molar ratio is, for the films of $M^{(x)}O_{x/2}$, greater than or equal to $(x/2-y)/z$, x being the valency of the metal oxide to be obtained, y being the number of oxygen atoms present in the starting precursor and z being the number of oxygen atoms present in the reactive gas.

6. The process as claimed in claim 1, wherein a reactive gas/gaseous precursor molar ratio, for the films of $M^{(x)}N_{x/3}$, is greater than or equal to $(x/3-y)/z$, x being the valency of the metal nitride to be obtained, y being the number of nitrogen atoms present in the starting precursor and z being the number of nitrogen atoms present in the reactive gas.

7. The process as claimed in claim 1, wherein the ratio of the flow rate of the reactive gas to the flow rate of the gaseous precursor is at least 10.

8. The process as claimed in claim 1, for the production of a glass substrate, further comprising:
depositing on and in direct contact with the substrate, an $SiO_2$ layer,
wherein the power density is greater than 5 W per $cm^2$ of plasma, a pressure of the PECVD device is between 3 and 20 mTorr, and wherein the gaseous precursor is an organosilane derivative and the reactive gas is pure oxygen.

9. The process as claimed in claim 1, further comprising:
depositing $SiO_2$ layers either directly on a glass substrate, or in a stack with other layers in any position, or else as an outermost layer of a stack, for the control of haze values in stacks intended for solar applications incorporating Low-E layers, said haze values being at least 5%,
wherein the power density is at most 10 W per $cm^2$ of plasma.

10. The process as claimed in claim 1, further comprising:
depositing $SiO_2$ layers either directly on a glass substrate, or in a stack with other layers in any position, or else as an outermost layer of a stack, for the control of haze values in stacks intended for solar applications incorporating Low-E layers, said haze values being less than 0.5%,
wherein the power density is at least 5 W per $cm^2$ of plasma, a pressure of the PECVD device is greater than 5 mTorr, and a ratio of the flow rate of the reactive gas to the flow rate of the gaseous precursor is greater than 15.

11. The process as claimed in claim 1, further comprising:
depositing layers chosen from the group consisting of $SiO_2$, $ZrO_2$ and $Al_2O_3$, either directly on a glass substrate or as an outermost layer of a stack,
wherein the power density is between 10 and 40 W per $cm^2$ of plasma, a pressure of the PECVD device is less than 10 mTorr, and a ratio of the flow rate of the reactive gas to the flow rate of the gaseous precursor is greater than 10.

12. The process as claimed in claim 1, further comprising:
depositing stacks on a glass substrate exhibiting antireflective (AR) properties, said stack comprising a succession of layers of high refractive indices and of low refractive indices,
wherein the power density is between 10 and 40 W per $cm^2$ of plasma, and a pressure of the PECVD device is less than 20 mTorr.

13. The process as claimed in claim 1, further comprising:
depositing a transparent $SiO_2$ layer on a glass substrate coated with a Low-E layer,
wherein the power density is greater than 5 W per $cm^2$ of plasma, a pressure of the PECVD device is less than 20 mTorr, and the rate of deposition is less than 200 nm.m/min.

14. The process as claimed in claim 1, for refreshing a surface of the glass,
wherein the power density is greater than 5 W $cm^2$ of plasma, the flow rate of gaseous precursor of an organosilane derivative is less than 200 sccm per linear meter of plasma source, the rate of deposition is less than 200 nm.m/min, and a pressure of the PECVD device is less than 15 mTorr.

15. The process as claimed in claim 1, wherein the flow rate of the gaseous precursor of films of oxides, of nitrides or oxynitrides of metals or semiconductors is between 100 and 400 sccm per linear meter of the plasma source.

16. The process as claimed in claim 1, further comprising obtaining a film having at most 2 atom % residues originating from the precursor.

17. The process as claimed in claim 1, further comprising obtaining a film having at most 0.5 atom % residues originating from the precursor.

18. A process for the production of films of oxides, of nitrides or of oxynitrides of metals or semiconductors on a substrate by the Plasma Enhanced Chemical Vapor Deposition (PECVD) method, comprising:
a) providing a low-pressure PECVD device comprising at least one hollow-cathode plasma source, which source comprises at least one electrode connected to an AC, DC or pulsed DC generator, for the deposition of said films on the substrate,
b) applying an electrical power to the plasma source, so that a power density of a plasma is between 15 and 100 kW per meter of plasma, and,
c) applying, to the substrate, a gaseous precursor of films of oxides, of nitrides or of oxynitrides of metals or semiconductors at a flow rate of less than 400 sccm per linear meter of the plasma source and a reactive gas based on oxygen or on oxygen-comprising derivatives or on nitrogen-comprising derivatives at a flow rate of between 500 and 20,000 sccm per linear meter of the plasma source,
wherein a ratio of the flow rate of the reactive gas to the flow rate of the gaseous precursor is greater than 5, and
wherein a rate of deposition is less than 400 nm.m/min.

19. The process as claimed in claim 18 wherein frequencies of the AC or pulsed DC generator are between 5 and 150 kHz.

20. The process as claimed in claim 18, wherein a reactive gas/gaseous precursor molar ratio is, for the films of $M^{(x)}O_{x/2}$, greater than or equal to $(x/2-y)/z$, x being the valency of the metal oxide to be obtained, y being the number of oxygen atoms present in the starting precursor and z being the number of oxygen atoms present in the reactive gas.

21. The process as claimed in claim 18, wherein a reactive gas/gaseous precursor molar ratio, for the films of $M^{(x)}N_{x/3}$, is greater than or equal to $(x/3-y)/z$, x being the valency of the metal nitride to be obtained, y being the number of nitrogen atoms present in the starting precursor and z being the number of nitrogen atoms present in the reactive gas.

22. The process as claimed in claim 18, wherein the ratio of the flow rate of the reactive gas to the flow rate of the gaseous precursor is at least 10.

23. The process as claimed in claim 18, for the production of a glass substrate, further comprising:
depositing on and in direct contact with the substrate, an $SiO_2$ layer,
wherein the power density is greater than 15 kW per meter of plasma, a pressure of the PECVD device is between 3 and 20 mTorr,
wherein the gaseous precursor is an organosilane derivative and the reactive gas is pure oxygen.

24. The process as claimed in claim 18, further comprising:
depositing $SiO_2$ layers either directly on a glass substrate, or in a stack with other layers in any position, or else as an outermost layer of a stack, for the control of haze values in stacks intended for solar applications incorporating Low-E layers, said haze values being at least 5%,
wherein the power density is at most 20 kW per meter of plasma.

25. The process as claimed in claim 18, further comprising:
depositing SiO$_2$ layers either directly on a glass substrate, or in a stack with other layers in any position, or else as an outermost layer of a stack, for the control of the haze values in stacks intended for solar applications incorporating Low-E layers, said haze values being less than 0.5%,
wherein the power density is at least 15 kW per meter of plasma, a pressure of the PECVD device is greater than 5 mTorr, and a ratio of the flow rate of the reactive gas to the flow rate of the gaseous precursor is greater than 15.

26. The process as claimed in claim 18, further comprising:
depositing layers chosen from the group consisting of SiO$_2$, ZrO$_2$ and Al$_2$O$_3$, either directly on a glass substrate or as an outermost layer of a stack,
wherein the power density between 20 and 50 kW per meter of plasma, a pressure of the PECVD device is less than 10 mTorr, and a ratio of the flow rate of the reactive gas to the flow rate of the gaseous precursor is greater than 10.

27. The process as claimed in claim 18, further comprising:
depositing stacks on a glass substrate exhibiting antireflective (AR) properties, said stack comprising a succession of layers of high refractive indices and of low refractive indices,
wherein the power density is between 20 and 50 kW per meter of plasma and a pressure of the PECVD device is less than 20 mTorr.

28. The process as claimed in claim 18, further comprising:
depositing a transparent SiO$_2$ layer on a glass substrate coated with a Low-E layer,
wherein the process is carried out with a power density greater than 15 kW per meter of plasma, a pressure of the PECVD device is less than 20 mTorr and the rate of deposition is less than 200 nm.m/min.

29. The process as claimed in claim 18, for refreshing a surface of the glass,
wherein the power density is greater than 15 kW per meter of plasma, the flow rate of gaseous precursor of an organosilane derivative is less than 200 sccm per linear meter of plasma source, the rate of deposition is less than 200 nm.m/min, and a pressure is less than 15 mTorr.

30. The process as claimed in claim 18 wherein the flow rate of the gaseous precursor of films of oxides, of nitrides or of oxynitrides of metals or semiconductors is between 100 and 400 sccm per linear meter of the plasma source.

31. The process as claimed in claim 18, further comprising obtaining a film having at most 2 atom % residues originating from the precursor.

32. The process as claimed in claim 18, further comprising obtaining a film having at most 0.5 atom % residues originating from the precursor.

* * * * *